United States Patent [19]

Carter et al.

[11] Patent Number: 4,458,220

[45] Date of Patent: Jul. 3, 1984

[54] ELECTRICAL CONNECTOR AND FILTER CIRCUIT

[75] Inventors: Paul Carter, Laguna Niguel; David J. Ball, Pacific Palisades, both of Calif.

[73] Assignee: Automation Industries, Inc., Greenwich, Conn.

[21] Appl. No.: 284,187

[22] Filed: Jul. 17, 1981 (Under 37 CFR 1.47)

[51] Int. Cl.³ ........................ H03H 7/01; H01R 23/08

[52] U.S. Cl. .................................... 333/182; 333/183; 339/147 R

[58] Field of Search ........................ 333/167, 181-185, 333/1 Z; 339/143 R, 143 C, 147 R, 147 P; 361/301-303

[56] References Cited

U.S. PATENT DOCUMENTS

| | | | |
|---|---|---|---|
| 3,275,953 | 9/1966 | Coda et al. | 333/182 |
| 3,289,118 | 11/1966 | Garstang | 333/182 |
| 3,710,285 | 1/1973 | Schor et al. | 333/182 |
| 4,079,343 | 3/1978 | Nijman | 333/185 X |

OTHER PUBLICATIONS

Denes et al.,–"Tiny Filters Block the Path of Radio-Frequency Interference", Electronics, Oct. 31, 1966; pp. 58-67.

*Primary Examiner*—Marvin L. Nussbaum
*Attorney, Agent, or Firm*—Francis N. Carten

[57] ABSTRACT

A plug and receptacle electrical connector has incorporated within one of its parts an insulative enclosure maintaining the pin or sockets contacts, as the case may be, in an electrically insulated relation, which enclosure also has cavities formed about each of the pin contacts for receiving inductors and/or one or more specially formed capacitors therein.

Each inductor is an elongated hollow cylinder formed of a magnetic material (e.g., sintered ferrite), one such inductor being received within a member cavity and the pin (or socket) contacts on being assembled in the connector part extending through the respective inductor openings. A capacitor consists of an insulative cylinder with an axial opening therethrough and has select portions coated with first and second electrically conductive film electrodes. One film electrode provides interconnection between adjacent capacitors when they are stacked within the receiving cavities and with spring-like contacts which interconnect one terminal of the capacitor/s to an electrically conductive ground shell. The other terminal of each capacitor is connected to a pin or socket contact, as the case may be.

8 Claims, 7 Drawing Figures

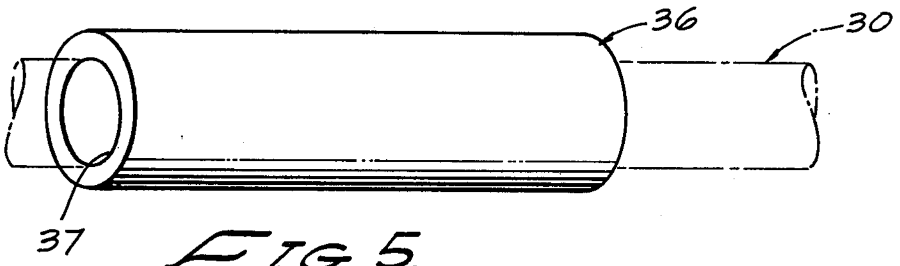
FIG. 5.
FIG. 6.
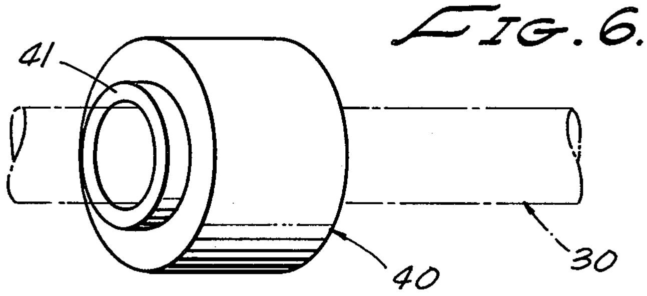
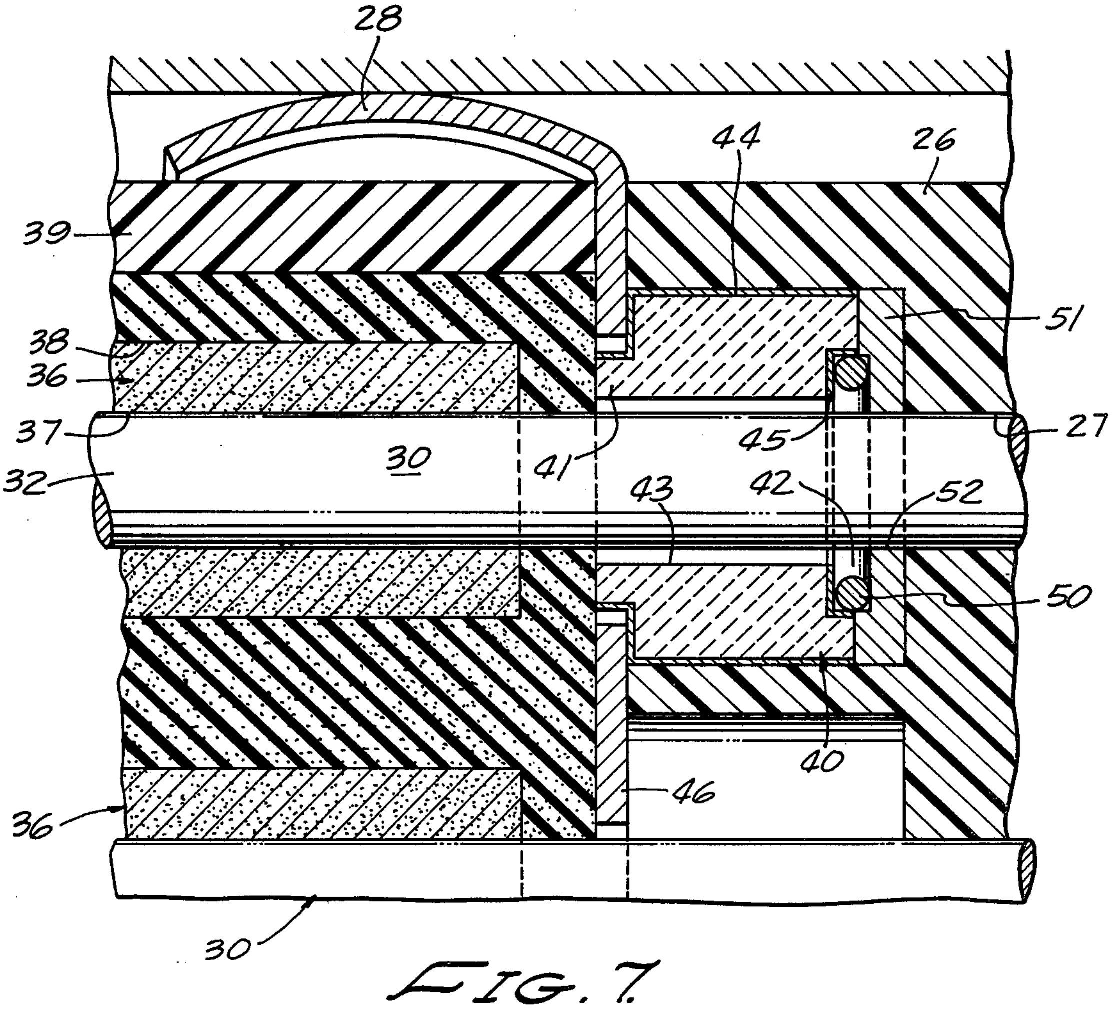
FIG. 7.

ELECTRICAL CONNECTOR AND FILTER CIRCUIT

The present invention relates generally to an electrical connector, and, more particularly, to an electrical connector having co-operable plug and receptacle parts with a filter circuit incorporated into one of the parts.

BACKGROUND OF THE INVENTION

A well-known form of present day electrical connector includes plug and receptacle parts which can be mated together for electrically interconnecting a plurality of pin and socket electrical contacts. An especially advantageous form of electrical connector of this general kind includes a rotatable external housing adapted through a coupling nut to removably secure the plug and receptacle parts together.

To prevent or at least reduce transient electrical disturbances, filtering circuits have been used with such connectors which although electrically effective have not been completely satisfactory in that they either exhibited poor resistance to shock and vibration, experienced difficulties resulting from unequal thermal expansion and contraction of parts, or there was a resultant failure or reduced efficiency of the connector due to ingress of moisture and impurities.

SUMMARY OF THE INVENTION

In the practice of the present invention, a plug and receptacle electrical connector includes incorporated within one of its parts an insulative enclosure maintaining the pin or socket contacts, as the case may be, in an electrically isolated relation, and which further includes cavities formed about each of the pin contacts for receiving inductors and/or one or more specially formed capacitors therein.

In construction, each inductor consists of an elongated hollow cylindrical member formed of a magnetic material (e.g., sintered ferrite), one such inductor being received within each member cavity and the pin (or socket) contacts on being assembled in the connector part extend through the respective inductor openings.

A capacitor consists of an insulative cylinder with an axial opening therethrough and has select portions of the interior coated with first and second electrically conductive film electrodes. The films on the surface of the capacitors provide means for interconnection between adjacent capacitors when they are stacked within the receiving cavities and with springlike contacts which interconnect one terminal of the capacitor/s to an electrically conductive shell via a ground plane which serves as electrical ground. The other terminal of each capacitor is connected to a pin or socket contact, as the case may be.

As to electrical operation, the arrangement of inductors and capacitors to be described form an L-C circuit from each pin (socket) contact to ground at a point closely adjacent where it connects with a mating contact. The filter circuit so formed may alternatively be a pi or T circuit.

DESCRIPTION OF THE DRAWING

FIG. 5 is an enlarged perspective view of an inductor for use in the connector filter.

FIG. 6 is a perspective view of a capacitor for use in the filter of this connector.

FIG. 7 is an enlarged sectional, partially fragmentary view of the capacitor shown assembled in the connector.

DESCRIPTION OF A PREFERRED EMBODIMENT

Figure 1:
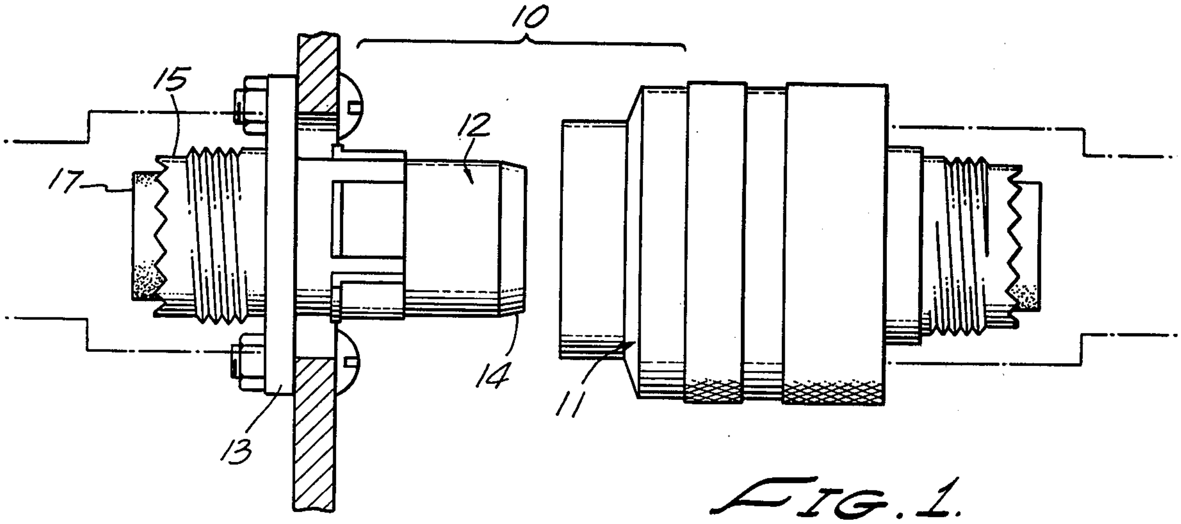
FIG. 1 is a side elevational view of a connector of the subject invention showing receptacle and plug parts uncoupled and separated.
Figure 2:
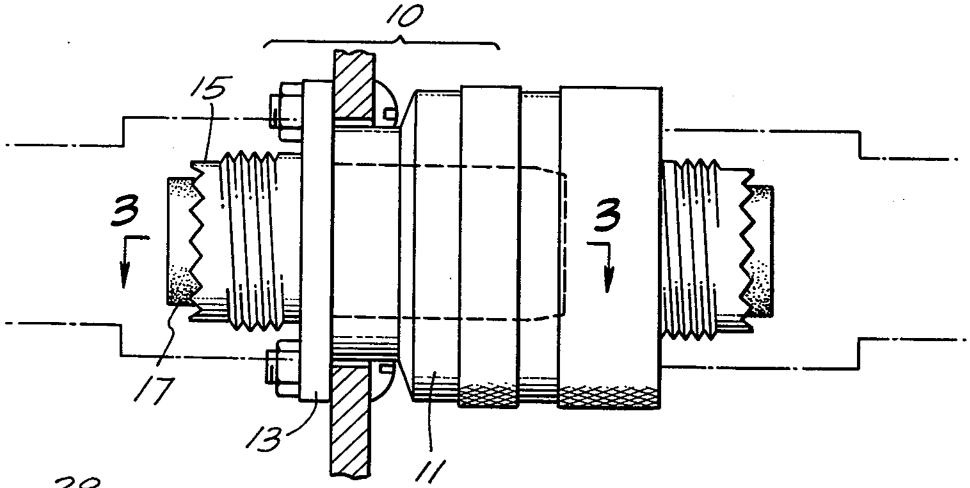
FIG. 2 is a side elevational view of the cable connector of FIG. 1 showing the parts coupled.

With reference now to the drawings, and particularly FIG. 1, a cable connector 10 with which the present invention is specifically advantageous is seen to include a receptacle 11 and a plug 12 which when interconnected serve to couple and electrically connect a plurality of cables or wires (not shown) the ends of which are secured within the receptacle and plug means in a known manner. That is, as is shown in FIG. 2, when the plug and receptacle are fully mated the various required interconnections between the cable wires are effected through the connector.

Figure 3:
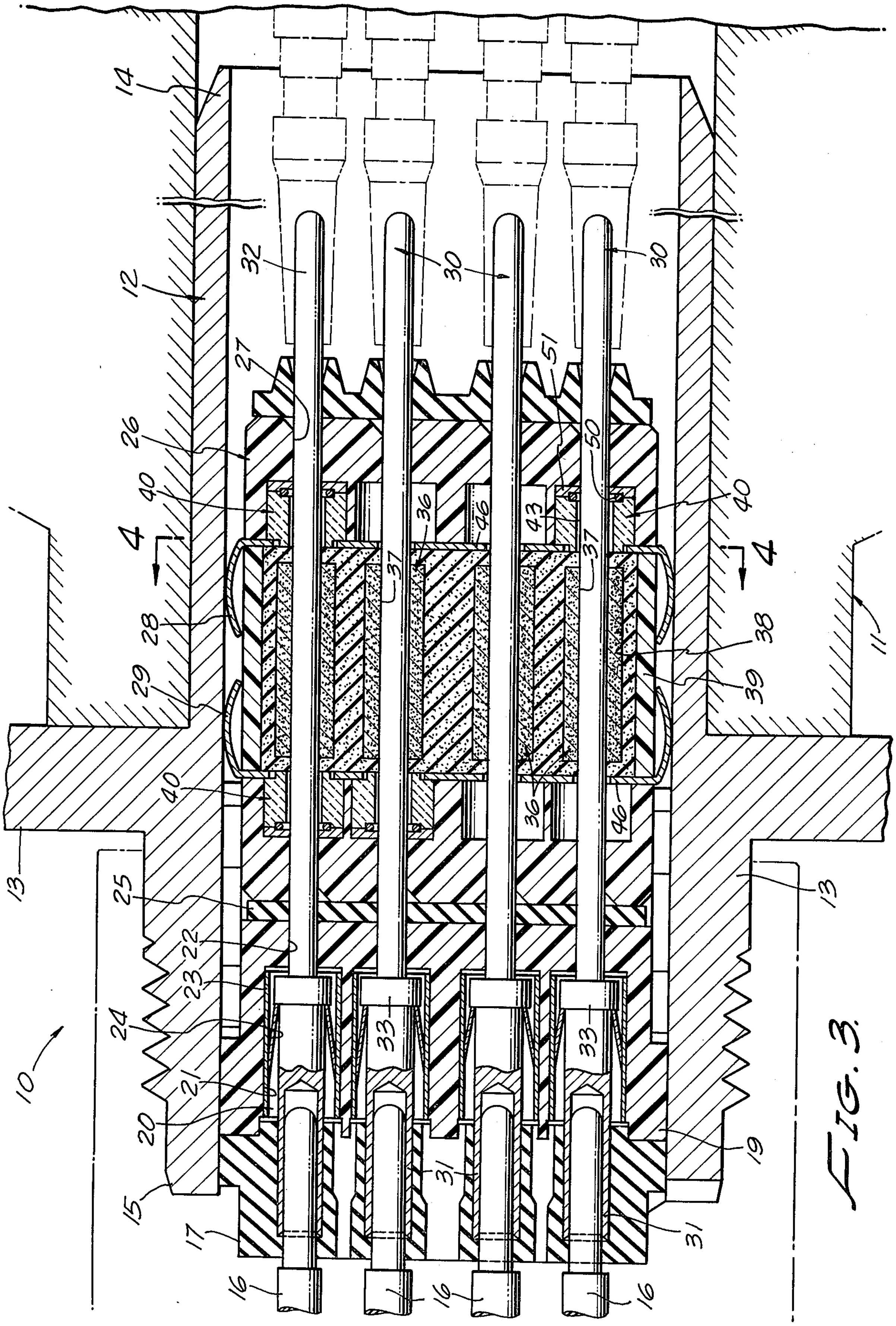
FIG. 3 is a side elevational, sectional view taken along the line 3—3 of FIG. 2.

Turning now to FIG. 3, an assembled and mated plug and receptacle are shown, the receptacle being shown in solid line with the immediately adjacent plug parts being depicted in dash-line. The special filter to be described can be incorporated within either the plug or the receptacle with equal advantage and, therefore, the ensuing description with respect to the receptacle is for convenience only and is not intended to be limitative on the broad contemplations of this invention.

The receptacle 11 includes a hollow, generally cylindrical metal housing 13 having a first end 14 adapted for mating receipt within appropriately dimensioned parts of the plug 12 and an opposite end 15 for receiving a plurality of cable wires 16 for connection in a manner to be described.

Turning now to FIG. 3, the housing cable end 15 has a generally cylindrical wire sealing grommet 17 constructed of a relatively soft, pliable rubber or plastic with peripheral dimensions enabling fitting receipt within the housing bore. A plurality of mutually spaced parallel openings 18 extend completely through the body of insert 17, each for accommodating a separate one of the cable wires 16 and sealing against the ingress of moisture, dirt, dust and the like.

A guide insert 19 located in juxtaposition to the grommet 17 is constructed of a relatively rigid insulative material and has a peripheral geometry and dimensions permitting snug conformance to the internal housing wall. Aligned with each grommet opening 18 is an opening 20 in 19 having a relatively large cross-sectional part 21 immediately adjacent the opening 18 and a smaller cross-sectional part 22 exiting into the central portions of the housing. Within each large cross-section opening 21 a leaf spring 23 fits along two opposite sides of the opening and incudes a spring tab 24 integral therewith extending angularly inwardly from 23. A foraminous insulative spacer 25 may be provided and which would abut against the inner surface of insert 19, the plate openings aligning with respective insert openings 22.

An elongate cylindrical multiple piece filter package 26 is arranged within the housing 13 with one end abutting against the plate 25. The filter package contains various electrical components to be described which are interrelated and interconnected with the connector contacts to form a filter circuit of desired electrical characteristics. A set of parallel openings 27 are formed in the package which can be brought into alignment with corresponding openings 22 in the insert 19. The package outer dimensions are slightly less than the bore cross-section of housing 13, with first and second contact springs 28 and 29 to be described in detail later herein, having parts extending radially from the filter enclosure to locate the package properly within the housing.

Before proceeding with the detailed description of the filter package 26 and included electrical components, it will be of assistance to set forth the general assembly of the connector parts described to this point. First, a plurality of pin contacts 30 are each individually interconnected with a cable wire 16. Specifically, a pin contact includes a hollowed-out end 31 within which a cable is received and secured therein by crimping, for example. An elongated rodlike portion 32 of the pin is separated from the hollowed-out end 31 by an enlarged annular shoulder 33.

Next, the pin contacts with wires attached are then forced through the openings 18 of grommet 17, openings 20 and 22 of the insert 19, the plate 25 and the filter package 26. When fully seated the spring tabs 24 lock behind the pin contact annular shoulder 33 securing the contact against withdrawal. A pin face seal 34 having appropriately formed openings therein may also be cemented to the end face of 26 prior to pin assembly.

The connector described to this point is of conventional construction except for the filter package 26, spring connectors 28 and 29, and included electrical components to be described. It is to be especially noted that the addition of the filter package 26 to the interior of the connector part does not prevent the pins (or sockets) from being assembled in the described manner.

One of the filter electrical components is an inductor 36, which as depicted in FIG. 5 is an elongated hollow cylinder having a bore 37 dimensioned to enable a sliding fit onto the rodlike portion 32 of a pin contact (FIGS. 3 and 7). The inductor is constructed of a material having a relatively high magnetic permeability and high electrical resistivity, such as a ferrite or so-called mumetal, for example. With the described inductor received onto a pin contact through which an electric current is passing, it has the effect electrically of placing an inductance in series with the pin contact. Each pin contact may be provided with an inductor, or only selected pin contacts may be so provided, as desired.

Each inductor 36 is received within one of a plurality of elongated cavities 38 in a cylindrical housing 39 of package 26. Preferably, the housing 39 is constructed of a highly insulative rubber (e.g., fluorosilicone rubber) having a Shore hardness in the range of about 80–90. The cavities 38 are aligned with the openings 27 through which the pin contacts pass and are of such dimensions as to hold the inductors substantially immovably therein. Preferably, the housing 39 is made in two separate pieces which, after the inductors and other electrical components to be described have been located in the receving cavities, are appropriately bonded together. During assembly, when the pin contacts are passed through the filter package the housing walls defining the cavities 38 hold the inductors in place as the pin contacts slide therethrough. The outer diameter of the contacts 32 closely approximates the inductor bore so when assembled together there is reasonably good inductance coupling which is important in achieving the optimum inductance.

With reference now particularly to FIGS. 6 and 7, the other electrical component of the filter is a capacitor 40 of generally cylindrical shape having a smaller diameter part 41 at one end and an annular recess 42 formed in the other end. An axial bore 43 of slightly larger diameter than that of a pin contact extends throughout the full length of the capacitor. The main body of the capacitor is constructed of a plurality of thin-film discs or plates (not shown) separated by a material having a high dielectric constant (e.g., barium titanate). On the outer surface of the insulator there are deposited first and second film terminal electrodes 44 and 45 which are electrically connected, respectively, to first and second sets of capacitor plates within the insulative body. More particularly, the electrode 44 is a continuous film or coating of a good conductor (e.g., silver) extending over the complete major circumferential periphery and the smaller diameter end 40 except for the outermost end face thereof. The second electrode 45 is a film or coating covering all surfaces of the recess 42, but which is electrically isolated from the first electrode by the axially facing annular end surface left free of electrode material.

Figure 4:
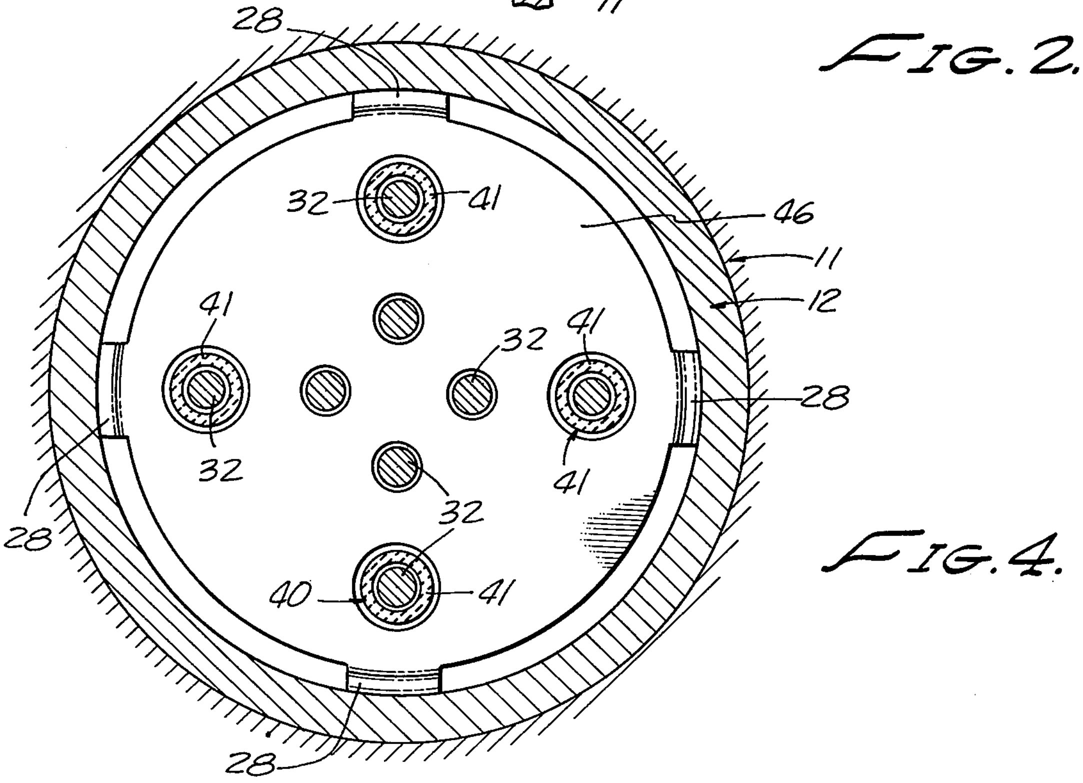
FIG. 4 is an end elevational, sectional view taken along the line 4—4 of FIG. 3.

The electrode 44 of each capacitor is connected to ground (housing 13) via one of the spring contacts 28 or 29, as the case may be. Each spring contact includes a flat metal disc 46 integrally related to contact springs 28 and 29 and of a diameter equal to that of the housing 39 having openings therein aligned with each pin contact and of such dimensions as to enable receipt of the capacitor small diameter end therethrough (FIGS. 4 and 7). It is to be noted that the openings in the metal disc are sufficiently large to readily admit the capacitor small diameter part therethrough and, of course, preclude the possibility of shorting out to a pin contact. Metal portions integral with the disc and lying beyond the filter enclosure periphery are formed at 90 degrees to the disc and bowed convexly toward the wall of the housing 13 forming the spring contacts 28 and 29. As can be seen best in FIG. 7, each capacitor clampingly engages portions of the spring contact disc in the immediate vicinity of the openings therein providing electrical connection of the electrodes 44 of each capacitor with the spring contacts, and thereby to ground. That is, when fully assembled the spring contacts 28 and 29 provide a continuous, resilient electrical path from one electrode of each of the capacitors to the housing 13 or ground.

Each capacitor 40 is received within separate cavities formed in a major surface of two disclike caps 48 and 49 respectively, located at each end of the inductor housing 39 and are of such geometry and dimensions as to secure the capacitor/s tightly therewithin. The cavities are arranged to align the capacitor bores with a housing opening and thereby to receive a pin contact. It is preferred that these disc caps be constituted of a relatively pliable rubber. The inductor housing 39, disclike caps 48 and 49 and connector springs 28 and 29, collectively form the filter package 26.

A metallic clip 50 is received within the capacitor end recess 42 in good contact with the electrode 45 and is of such thickness that it extends slightly outwardly of the recess beyond the capacitor end (FIG. 7). A metallic pressure plate 51 has an opening 52 which tightly engages a pin contact passing therethrough and presses against the clip 50 thereby interconnecting the pin contact and capacitor electrode 45.

As alternative connection means for the clip and pressure plate, a wire mesh member or conductive rubber element may be used for this purpose.

There is provided in accordance with the practice of this invention, a filter package readily incorporated into one of the connector parts of a plug or receptacle connector that eliminates the necessity of making a fixed electrical connection such as by soldering, for example. Filtering may be provided for each pin (socket) contact or any selected contact/s. Also, the filter for a given contact may include an inductor used alone, a capacitor alone, an inductor with one capacitor, or an inductor with a capacitor at both sides of the inductor.

We claim:

1. A filter package adapted for use with a plug and receptacle connector in which a pin contact is releasably mated with a socket contact, comprising:

enclosure means having an opening extending therethrough for receiving a connector contact and including first and second enlarged spaced apart cavities located along said opening and in open communication with said opening;

a body of magnetic material having an opening of a size enabling fitting receipt of the connector contact therethrough, said magnetic body being received in the means first cavity with the body opening aligned with the enclosure opening;

a substantially cylindrical capacitor having an axial opening of a size enabling receipt of the connector contact therethrough, said capacitor having first and second terminal electrodes on a peripheral surface and one end surface of said capacitor, respectively;

said second electrode is deposited within a recess in the capacitor end, a conductive member being received in said recess, said member having parts extending beyond the capacitor end, and a conductive disc clampingly received onto the conductive member parts and contacting the connector contact; and spring contact means carried by said enclosure means contacting one of said capacitor terminal electrodes.

2. A filter package as in claim 1, in which the magnetic body is constructed of a material having a relatively high magnetic permeability and a relatively high electrical resistivity.

3. A filter package as in claim 1, in which said magnetic body is constructed of a ferrite.

4. A filter package as in claim 1, in which said magnetic body is constructed of mu-metal.

5. A filter package as in claim 1, in which said magnetic body is in hollow cylindrical form, the bore being of such dimensions as to provide a flush contacting relation with a connector contact received therein.

6. A filter package as in claim 1, in which the plug and receptacle connector parts include metallic housing means and the spring contact means have parts extending outwardly of said enclosure contacting inner wall surfaces of said housing means.

7. A filter package as in claim 1, in which the plug a receptacle connector parts include a metallic housing means and the spring contact means have parts extending outwardly of said means for receiving a connnector contact contacting inner wall surfaces of said housing means.

8. A filter package for use with a plug and receptacle connector in which a pin contact is releasably mated with a socket contact, comprising:

means having an opening extending therethrough for receiving a connector contact and including a cavity extending along and in open communication with said opening;

a substantially cylindrical capacitor having an axially disposed opening of a size enabling receipt of the connector contact therethrough, said capacitor having first and second conductive film terminal electrodes located on the circumferential surface and circular end surface, respectively;

said second electrode being deposited within a recess in a circular end of the capacitor, a conductive member being received in said recess, said member having parts extending outwardly beyond the capacitor end, and a conductive disc clampingly received onto the conductive member parts and contacting the connector contact; and spring contact means carried by said means contacting one of said capacitor terminal electrodes.

* * * * *